United States Patent
Gonda (10) Patent No.: US 8,013,521 B2
(45) Date of Patent: Sep. 6, 2011

(54) ORGANIC EL DEVICE AND ELECTRONIC APPARATUS

(75) Inventor: Akira Gonda, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 266 days.

(21) Appl. No.: 12/269,458

(22) Filed: Nov. 12, 2008

(65) Prior Publication Data

US 2009/0153036 A1 Jun. 18, 2009

(30) Foreign Application Priority Data

Dec. 14, 2007 (JP) ................................. 2007-322962

(51) Int. Cl.
*H05B 33/00* (2006.01)
(52) U.S. Cl. ........................................ 313/504; 313/506
(58) Field of Classification Search .......... 313/498–512; 315/169.3; 345/36, 45, 76
See application file for complete search history.

(56) References Cited

U.S. PATENT DOCUMENTS

| | | | | |
|---|---|---|---|---|
| 7,176,620 B2 * | 2/2007 | Tsujimura et al. | ............ | 313/506 |
| 2003/0156240 A1 * | 8/2003 | Oda et al. | ...................... | 349/113 |
| 2003/0197466 A1 * | 10/2003 | Yamazaki et al. | ............ | 313/504 |
| 2003/0201447 A1 * | 10/2003 | Yamazaki et al. | .............. | 257/79 |
| 2005/0231670 A1 * | 10/2005 | Hashiguchi et al. | .......... | 349/138 |
| 2006/0186804 A1 * | 8/2006 | Sakakura et al. | ............. | 313/506 |
| 2007/0102737 A1 * | 5/2007 | Kashiwabara et al. | ....... | 257/291 |

FOREIGN PATENT DOCUMENTS

| JP | A-2002-132186 | 5/2002 |
|---|---|---|
| JP | A-2003-076301 | 3/2003 |
| JP | A-2007-026849 | 2/2007 |

* cited by examiner

*Primary Examiner* — Nimeshkumar Patel
*Assistant Examiner* — Christopher Raabe
(74) *Attorney, Agent, or Firm* — Oliff & Berridge, PLC (57) ABSTRACT

An organic EL device includes: a first electrode which have a light-transmitting property; a transflective film; an organic light emission layer which is disposed between the first electrodes and the transflective film; a reflective film which is disposed on opposite side of the first electrode than the transflective film; and a first light emission pixel which includes a connective conduction portion formed to cover a stepped portion of the end of the reflective film. The connective conduction portion includes conductive films having a light-transmitting property and is electrically connected to a switching element of the first light emission pixel. In addition, the first electrode is formed by selecting and patterning at least one layer of the conductive films included in the connective conduction portion.

10 Claims, 3 Drawing Sheets

ORGANIC EL DEVICE AND ELECTRONIC APPARATUS

BACKGROUND

1. Technical Field

The present invention relates to an organic EL device and an electronic apparatus.

2. Related Art

As a luminescence element using a phenomenon of light emission occurring thanks to the electron-hole recombination, an organic luminescence element (hereinafter, referred to as an organic EL element) is known. The organic EL element includes an organic functional layer having an organic light emission layer formed of an organic EL material between anodes supplying electron holes and cathodes supplying electrons, and emits light when the supplied electron holes and the supplied electrons are recombined.

As a device including the organic EL element, there is an organic electroluminescence device (hereinafter, referred to as an organic EL device) (for example, JR-A-2002-132186 and JP-A-2003-76301). The organic EL device includes a TFT substrate in which TFTs are arranged in a matrix shape, for example, and an interlayer insulation film which covers the TFTs. Openings are formed through the interlayer insulation film on drains of the TFTS, and source electrodes electrically connected to the drains of the TFTs are formed inside the openings. A ground layer such as a protective film or a flatness layer covering the source electrodes and the interlayer insulation film is provided. In the ground layer, openings are formed on the source electrodes. A conductive film electrically connected to each of the source electrodes is provided inside each of the openings. The conductive film is drawn up to a predetermined location (pixel opening) on the flatness layer and configured as a pixel electrode in the pixel opening. The pixel electrode functions as an electrode (anode) of the organic EL element. The organic functional layer and a cathode are formed above the pixel electrode.

This organic EL device is broadly classified into a bottom emission type organic EL device obtaining light from the anode and a top emission type organic EL device obtaining light from the cathode. The top emission type organic EL device includes a reflective film which reflects the light emitted from the anode toward the cathode. Specifically, the reflective film (for example, an aluminum film) is formed at the locations corresponding to the pixel openings on the flatness layer. In addition, the conductive film electrically connected to the source electrode is drawn up to the reflective film.

In the top emission type organic EL device capable of realizing a full color display, a configuration in which the cathode is configured as a transflective film and the anode and the reflective film form a resonator may be taken into consideration (for example, JP-A-2007-26849). Specifically, a minimum unit for realizing the full color display is formed by a plurality of monochromatic display members (for example, red, green, and blue members). One monochromatic display corresponds to one organic EL element. For example, the thickness of the pixel electrode can be varied by forming a film with a material for forming the conductive film three times in a portion corresponding to the red member, two times in a portion corresponding to the green member, and once in a portion corresponding to the blue member. With such a configuration, it is possible to adjust an optical distance between the cathodes and the reflective film, that is, a resonant wavelength. Accordingly, light having wavelengths corresponding to respective colors can be emitted from the anodes, thereby obtaining a satisfactory display.

However, when the pixel electrodes formed by the conductive films having a plurality of layers are used, a problem may occur in that a cut portion occurs in the periphery of the pixel electrode. In particular, the cut portion occurs in the thinnest pixel electrode (for example, the blue member). That is, the reflective film is provided below portions in which the pixel electrodes are formed. In addition, a stepped portion is formed on the reflective film and the periphery of the reflective film. When the material for forming the pixel electrodes is cut in the stepped portion, the cut portion is filled with the material in the pixel electrodes corresponding to the green and red members upon forming the film two times. However, the cut portion just remains in the pixel electrode corresponding to the blue member without repair, since the film is formed just once. When the cut portion occurs in the pixel electrodes, the organic EL elements corresponding to the pixel electrodes may not emit light and become black points. Accordingly, a display failure arises. When only one monochromatic display member (for example, the blue member) becomes the black point, a desired full color display may not be obtained, thereby degrading a display quality.

SUMMARY

An advantage of some aspects of the invention is that it provides an organic EL device capable of achieving a high display quality and a high image quality.

According to an aspect of the invention, there is provided an organic EL device including: first electrodes which have a light-transmitting property; a transflective film; an organic light emission layer which is disposed between the first electrodes and the transflective film; reflective films which are disposed opposite the transflective film in the first electrodes; and light emission pixels which each include a connective conduction portion formed to cover a stepped portion of the end of the reflective film. The connective conduction portion includes a plurality of conductive films having a light-transmitting property and is electrically connected to a switching element of the light emission pixel. In addition, the first electrode is formed by selecting and patterning at least one layer of the conductive films included in the connective conduction portion.

Normally, the connective conduction portion including the plurality layered conductive films is proved in the vicinity of the reflective film. Several (for example, one layer) among the conductive films are drawn to the center portion of the reflective film beyond the stepped portion of the end of the reflective film. The portion corresponding to a pixel among the conductive films drawn to the center portion thereof operates as the pixel electrode. In general, when the stepped portion is formed of a thin conductive film, the fact that a cut portion easily occurs in the stepped portion is known.

According to the organic EL device having the above-described configuration, the connective conduction portion includes the plurality layered conductive films covering the stepped portion of the end of the reflective film. Therefore, the stepped portion can be covered with the thicker conductive film, compared to a case where the stepped portion is covered with a part (for example, one-layered conductive film) of the connective conduction portion. With such a configuration, the stepped portion is covered in a wider range, thereby preventing the cut portion form occurring. Accordingly, since the first electrode is better connected to the switching element and the organic light emission layer satisfactorily emits light, the organic EL device is realized without a black point.

In the organic EL device having the above-described configuration, the thickest conductive film among the plurality of conductive films included in the connective conduction portion may be disposed closest to the reflective film. In this case, the thickness of the conductive film disposed close to the reflective film among the plurality of conductive films included in the connective conduction portion may be equal to or larger than the thickness of the conductive film disposed closer to the transflective film than the conductive film.

The first electrode and the switching element are electrically connected to each other, when just one conductive film which is not cut is included in the connective conduction portion. When the thickest conductive film is disposed so as to be closest to the reflective film, the occurrence of the cut portion is reduced, compared to a case where a thinner conductive film is disposed. Accordingly, the first electrode is more satisfactorily connected to the switching element.

When a conductive film formed of the same material as that of the lower layer, for example, is laminated on the conductive film in which the cut portion does not occur, it is difficult for the cut portion to occur thanks to affinity of the upper layer with the lower layer. Accordingly, the occurrence of the cut portion is reduced in any conductive film of the conductive films included in the connective conduction portion. With such a configuration, the connective conduction portion is improved in reliability and resistance, thereby achieving the satisfactory light emission of the organic light emission layer.

The connective conduction portion can be further improved when the thickness of the conductive film disposed to be close to the reflective film is equal to or larger than the thickness of the conductive film disposed to be close to the transflective film. That is, when the conductive film formed of the same material as that of the conductive film in which the cut portion occurs is laminated on the conductive film in which the cut portion occurs, a part of the whole of the cut portion can be covered with the conductive material from the surrounding toward the inside thanks to the affinity with the lower layer. With such a configuration, it is possible to repair the cut portion by covering or reducing the cut portion. Since a thick film is formed with the conductive material on the cut portion, the cut portion is better repaired, compared to a case where a thin film is formed. Therefore, by disposing the thicker conductive film in the lower layer among the conductive films formed in the conductive film in which the cut portion occurs, it is possible to prevent the cut portion from occurring in the conductive film of the upper layer in the connective conduction portion.

In the organic EL device having the above-described configuration, the connective conduction portion may include three or more conductive films, and the locations of the ends of the conductive films which do not form the first electrode among the conductive films may be different from each other on the periphery of the reflective film.

With such a configuration, the ends of the conductive films which do not form the first electrode are configured as the stepped portions of the upper layer and the lower layer and the locations of the stepped portions are different from each other. Therefore, the stepped portions become small, compared to a case where the locations of the ends of the conductive films which do not form the first electrode are equal to each other. Accordingly, since the stepped portions of the conductive films forming the first electrode are improved in a range of the stepped portion, the cut portion is prevented from occurring in the conductive films forming the first electrode.

In the organic EL device having the above-described configuration, the plurality of light emission pixels may be provided, partition walls may be provided between the light emission pixels, and the ends of the reflective films may be covered with the partition walls. In this case, the end of the conductive film which does not form the first pixel among the plurality of conductive films of the connective conduction portion may be covered with the partition wall.

With such a configuration, the reflective film is disposed in the whole area between the partition walls, that is, the whole area where light is emitted from the organic light emission layer to the reflective film. Therefore, the emitted light can reflect toward transflective film without light leakage toward the ground layer of the reflective films. Since the reflective film in the end of the reflective film and the stepped portion of the ground layer can be covered with the partition walls, it is possible to avoid damage to a display quality which is caused by reflection of light from the stepped portion. Moreover, when the ends of the conductive films which do not form the first electrode are covered with the partition walls, it is possible to avoid damage to a display quality which is caused by reflection of light from the stepped portion between the conductive films.

In the organic EL device having the above-described configuration, the plurality of light emission pixels having different emission wavelengths one another may be provided. In addition, the thicknesses of the first electrodes forming the light emission pixels may be different from each other thanks to the thicknesses of the conductive films selected in the connective conduction portion. In addition, the emission wavelength of the light emission pixel may be a resonant wavelength determined by an optical distance between the transflective film and the reflective film forming the light emission pixel, and the optical distance is adjusted with the thickness of the first electrode forming the light emission pixel.

With such a configuration, it is possible to realize the organic EL device capable of achieving a full color display by forming the light emission pixels having emission wavelengths corresponding to respective red (R), green (G), and blue (B) colors.

The organic EL device having the above-described configuration may further include a color filter layer which transmits light of wavelengths corresponding to the emission wavelengths of the light emission pixels having the transflective film and is formed opposite the reflective films in the transflective film.

With such a configuration, it is possible to absorb external light by the color filter layer, thereby realizing the organic EL device capable of further reducing reflection of the external light. That is, light (light corresponding to transparent wavelengths of the color filter layer) which cannot be absorbed by the color filter layer is absorbed by a resonator formed by the transflective film and the reflective films. Accordingly, the light which cannot be absorbed by the color filter layer does not nearly affect to the display quality. That is, the resonator has a very high transmissivity and a very low reflectance for the light transmitted through the color filter layer, since the transparent wavelength of the color filer layer is almost equal to the resonant wavelength of the resonator. Accordingly, the external light which passes through the color filter layer and is incident within the resonator does not almost reflect toward the outside thanks to the absorption in the resonator.

In the organic EL device having the above-described configuration, the color filter layer may be provided with three types of color material members transmitting light having three kinds of different wavelengths, and the connective conduction portion may include three-layered conductive films. In addition, the light emission pixel having the first electrode formed by one-layered conductive film, the light emission pixel having the first electrode formed by two-layered conductive films, and the light emission pixel having the first electrode formed by the connective conduction portion may be provided.

With such a configuration, it is possible to manufacture the organic EL device having the above-described configuration by using processes normally performed upon manufacturing the organic EL device. That is, the connective conduction portion including the three-layered conductive films from the source electrode to the reflective film is formed. However, when the reflective film is expanded up to the location where the connective conduction portion is formed, the connective conduction portion is formed continuously in the periphery and the edge of the reflective film using the normally performed patterning. In this way, it is possible to manufacture the organic EL device without an increase in process cost and realize the organic EL device with high reliability using the proven processes.

According to another aspect of the invention, there is provided an electronic apparatus comprising the organic EL device having the above-described configuration.

With such a configuration, the organic EL device having the above-described configuration is realized without the block point. Accordingly, the electronic apparatus including the organic EL device can be realized satisfactorily.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described. The technical scope of the invention is not limited to the embodiment described below. In order to enable easy illustration of features of elements in detailed description with reference to the accompanying drawings, the elements are appropriately illustrated in different sizes and with different scales. In an organic EL device according to the embodiment, light emission pixels are arranged in a matrix shape. The light emission pixels corresponding to red light, green light, and blue light are periodically arranged in one arrangement direction. In addition, the light emission pixels corresponding to any one of the red light, the green light, and the blue light are arranged in a direction perpendicular to the arrangement direction. With such a configuration, combination of monochromatic light (red, green, and blue light) enables a full color display. In such a display device, the light emission pixels corresponding to the monochromatic light are also called sub-pixels.

Figure 1:
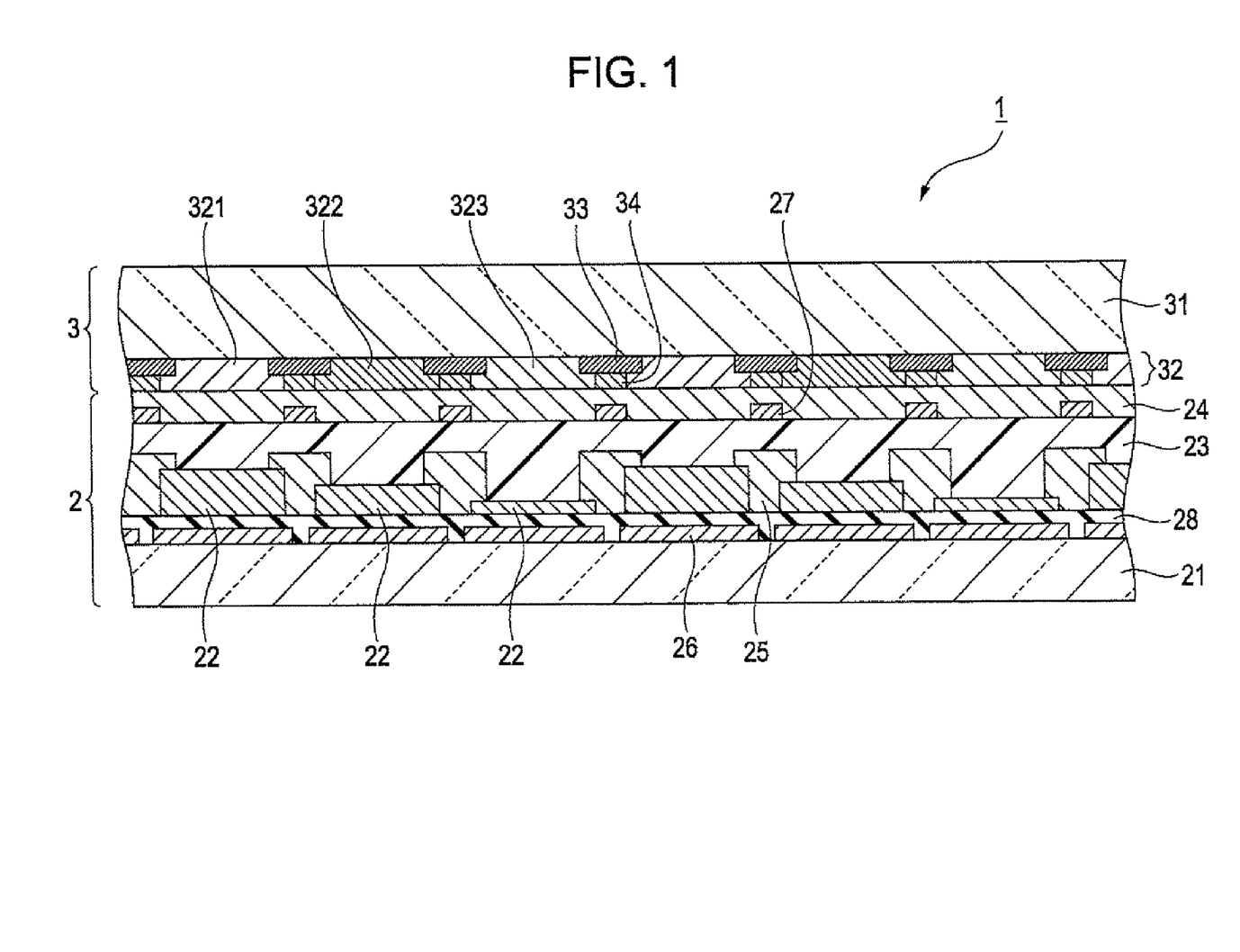
FIG. 1 is a schematic sectional view illustrating the overall configuration of an organic EL device according to the invention.

FIG. 1 is a side sectional view illustrating the overall configuration of an organic EL device 1 according to the embodiment. An area including six light emission pixels are shown in the cross section in the arrangement direction. That is, two sets of light emission pixels (sub-pixels) corresponding to a red color, a green color, and a blue color are illustrated. First electrodes 22, which are the features of the invention, will be described in detail with reference to the accompanying expanded views below and the overall structure of the first electrodes 22 are illustrated in FIG. 1.

As illustrated in FIG. 1, the organic EL device 1 includes an organic EL substrate 2 which includes the pixel electrodes (first electrodes) 22, an organic functional layer 23, and a common electrode (transflective film) 24 in sequence on a TFT array substrate 21. The organic EL device 1 further includes a color filter substrate 3 provided with a color filter layer 32 on a transparent substrate 31 opposite the organic EL substrate 2 so as to be close to the organic EL substrate 2. The organic EL substrate 2 and the color filter substrate 3 are attached and sealed to each other by a seal member (not shown) provided between the edge of the TFT array substrate 21 and the edge of the transparent substrate 31.

The organic EL substrate 2 includes the TFT array substrate 21 having a ground layer such as a flatness film, a reflective film 26 which is selectively formed on the ground layer, the pixel electrodes 22 formed on the reflective film 26, partition walls 25 formed between the pixel electrodes 22, the organic functional layer 23 integrally covering the pixel electrodes 22 and the partition walls 25, and the common electrode 24 formed to cover the organic functional layer 23. In this embodiment, supplementary wirings 27 are formed on the organic functional layer 23 and on portions located above the partition walls 25. An insulation film 28 is formed between the reflective film 26 and the pixel electrodes 22. The pixel electrodes 22, the organic functional layer 23, and the common electrode 24 form organic EL elements. The common electrode 24 functions as an electrode and also functions as a transflective film. A space between the common electrode 24 and the reflective film 26 operates as a resonator. In this embodiment, the pixel electrodes 22 function as anodes and the common electrode 24 functions as a cathode.

In this embodiment, the detailed structure of the TFT substrate 21 is not illustrated. In the TFT substrate 21, a plurality of data lines extending from a data line driving circuit and a plurality of scanning lines extending from a scanning line driving circuit are arranged in a lattice shape. The light emission pixels are formed in portions defined by the data lines and the scanning lines. Moreover, the organic EL elements and TFTs functioning as switching elements or driving elements are provided in the portions defined by the data lines and the scanning lines. The pixel electrodes 22 of the organic EL elements are electrically connected to the TFTs.

The reflective film 26 is formed of a metal film such as an aluminum film or a silver film having a light reflection property. In this embodiment, the reflective film 26 formed of AlNd having a thickness of about 80 nm is used. The reflective film 26 according to this embodiment is formed in a stripe shape across the plurality of light emission pixels (sub-pixels) along the direction perpendicular to the arrangement direction of the light emission pixels described above, that is, in a direction in which the light emission pixels corresponding to one type of the red color, the green color, and the blue color are arranged. The plurality of pixel electrodes 22 are not electrically connected to each other by interposing the insulation film 28 between the reflective film 26 and the pixel electrodes 22. The insulation film 28 is made of SiN, for example, and has a thickness of 50 nm.

The pixel electrodes 22 are formed of a conductive material having a light-transmitting property and a high work function (for example, 5 eV or more), specifically, ITO (Indium Tin oxide) or the like. Electron holes (carrier) are effectively supplied from the pixel electrodes 22 to the organic functional layer 23. One pixel electrodes 22 corresponds to one of three color material members (which are described below) provided in the color filter substrate 3. The thickness of the pixel electrode 22 depends on a wavelength of light transmitted through the color material member corresponding to each pixel electrode 22.

The common electrode 24 is formed of a conductive material having a light-transmitting property and a low work function (for example, 5 eV or less). Examples of the conductive material having the low work function include a calcium metal, a magnesium metal, a sodium metal, a lithium metal, and a metallic compound thereof which are metallic fluoride such as calcium fluoride, metallic oxide such as lithium oxide, and organometallic complex such as calcium acetylacetonate. In this embodiment, the common electrode 24 formed of magnesium and silver is used and the electron holes (carrier) are effectively supplied from the common electrode 24 to the organic functional layer 23. Since the supplementary wirings 27 formed of aluminum or the like and having low resistance are arranged in the common electrode 24, the common electrode 24 operates with low consumption power. Moreover, the common electrode 24 functions as a transflective film which transmits a part of light from the organic functional layer 23 and reflects a part or the whole of the remaining light toward the reflective film 26. In general, the common electrode formed of a conductive film having a light-transmitting property has a function of the transflective film described above.

The organic functional layer 23 include an organic light emission layer formed of an organic EL material. In general, the organic functional layer has a structure of sequentially laminating a hole-injecting layer and an organic light emission layer from an anodes side. Alternatively, the organic functional layer may have a structure of providing a hole-carrying layer between the hole-injecting layer and the organic light emission layer, a structure of providing a hole-injecting/carrying layer instead of the hole injection layer, or a structure of providing an electron-injecting (carrying) layer on a cathode side of the organic light emission layer in formation with a deposition method using a low molecule-based material additionally. Electron holes are injected from the pixel electrodes 22 to the hole-injecting layer and thus carried to the organic light emission layer through the hole-carrying layer when voltage is applied between the pixel electrodes 22 and the common electrodes 24. Then, electrons are injected from the common electrode 24 to the electron-injecting layer and then the electrons are carried to the organic light emission layer through the electron-injecting (carrying) layer. The organic light emission layer emits light by recombination of the electron holes and the electrons carried to the organic light emission layer.

As the material of the organic functional layer 23, a known material may be used or materials described below may be used.

Examples of the hole-injecting layer include polythiophene derivative, polyaniline derivative, and polypyrrole derivative.

Examples of a material of the hole-carrying layer include TAPC, TPD, α-NPD, m-MTDATA, 2-TNATA, TCTA, spiro-TAD, (DTP) DPPD, HTM1, TPTE1, NTPA, TFLTF, polyfluorene derivative (PE) or polyparaphenylenevinylene derivative (PPV), polyparaphenylene derivative (PPP), polyvinylecarbazole (PVK), polythiophene derivative, and a polysilane-based organic polymer material such as polymethyphenylsilane (PMPS).

Examples of a material of the organic light emission layer include an organic polymer material such as penylene colorant, coumarin colorant, or rhodamine colorant; a substance formed by doping a low molecule organic material such as rubrene, perylene, 9,10-diphenylanthracene, tetraphenylbutadiene, nile red, coumarin 6, or quinacridone with the organic polymer material; and a phosphorescence material such as CBP (4,4,-dicarbazole-4,4-biphenyl) derivative, PtOEP (Platinum Octaethyl Porphyrin) derivative, Ir(ppy) 3 (iridium complex) derivative, or FIrpic (iridium complex) derivative, in addition to the material for forming the hole-carrying layer described above. In the invention, it is preferable that light emitted from the organic light emission layer is white.

Examples of a material of the electron-carrying layer include oxadiazole derivative, oxazole derivative, phenanthroline derivative, anthraquinone dimethane derivative, benzoquinone derivative, naphthoquinone derivative, anthraquinone derivative, tetracyano anthraquinone dimethane derivative, fluorenone derivative, diphenyldicyanoethylene derivative, diphenoquinone derivative, and hydroxyquinoline derivative.

Light emitted from the organic light emission layer to the pixel electrodes 22 transmits through the pixel electrodes 22 and reflects from the reflective film 26 to be obtained from the common electrode 24. Light having wavelengths other than a predetermined wavelength reflects from the reflective film 26 and reciprocates in a space between the common electrode 24 and the reflective film 26, since the common electrode 24 functions as the transflective film. In this way, only light having resonant wavelengths corresponding to optical distances between the common electrode 24 and the reflective film 26 is amplified and obtained. That is, the space between the common electrode 24 and the reflective film 26 functions as a resonator, and thus light having high light emission brightness and a sharp spectrum can be emitted from the space. In addition, the optical distances are calculated by a sum of optical distances of layers included between the common electrode 24 and the reflective film 26. An optical distance of each layer is calculated by a product of the layer and a refractive index.

The color filter substrate 3 includes light-shielding portions 33 made of chrome having a non-light-transmitting property and selectively provided on the transparent substrate 31, which is made of acryl, glass, or the like, close to the organic EL substrate 2; partition walls 34 provided on the light-shielding portions 33 close to the organic EL substrate 2; and a color filter layer 32 provided between the partition walls 34. A reflection prevention film (not shown) is attached on the transparent substrate 31 opposite the organic EL substrate 2. The color filter layer 32 includes color material members formed of a transparent resin containing a pigment or the like. In this embodiment, the color filter layer 32 includes red members (color members) 321, green members (color members) 322, and blue members (color members) 323 which are periodically arranged.

The thickness of each pixel electrode 22 is adjusted in a portion located in each color material members so that the wavelength of the light emitted from the organic EL element to the color material member becomes a wavelength corresponding to the color material member. That is, the thickness of each pixel electrode 22 adjusts the optical distance of the resonator, so that the resonant wavelength of the resonator becomes a predetermined wavelength corresponding to each color material member. Hereinafter, the structure of the pixel electrodes 22 will be described in detail.

Figure 2A:
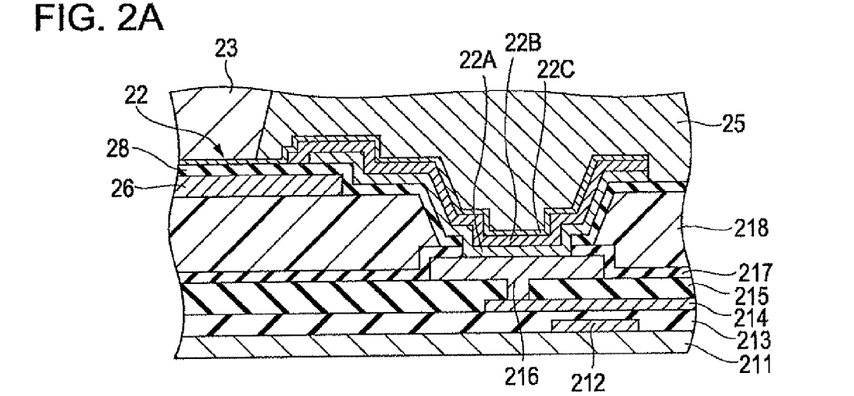
FIG. 2 is an expanded sectional view illustrating major elements of the organic EL device.
Figure 2B:
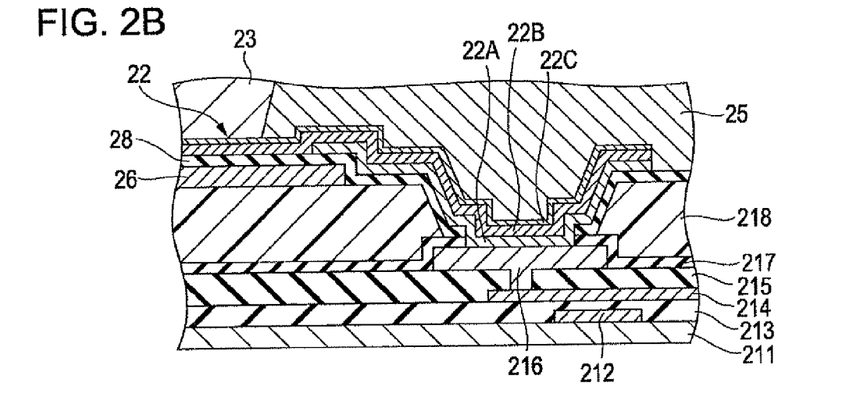
Figure 2C:
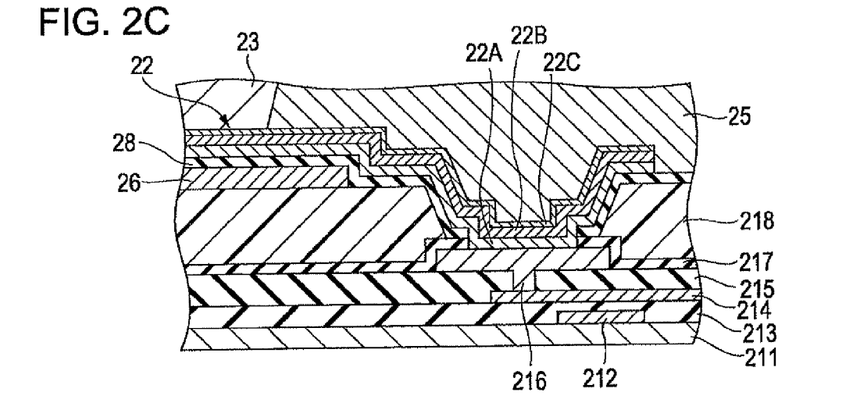

FIGS. 2A to 2C are side sectional views expanding the vicinities of the pixel electrodes 22 of the organic EL device 1. FIG. 2A shows a portion corresponding to the blue member 323, FIG. 2B shows a portion corresponding to the green member 322, and FIG. 2C shows a portion corresponding to the red member 321. As illustrated in FIGS. 2A to 2C, the portions corresponding to the respective color members have the same structure other than portions on the reflective film 26. That is, gate electrodes 212 diverged from the scanning lines are provided on a substrate 211 and the gate electrodes 212 are covered with a gate insulation film 213. Semiconductor layers 214 are provided in portions superimposed with the gate electrodes 212 and on the gate insulation film 213. The gate insulation 213 and the semiconductor layers 214 are covered with an interlayer insulation film 215 and openings for exposing the semiconductor layers 214 are formed through the interlayer insulation film 215. Inside the openings and in the peripheries of the openings, source electrodes 216 are provided in the interlayer insulation film 215. Each of the semiconductor layers 214 is configured as a channel in a portion superimposed with the gate electrode 212 and one side thereof comes in contact with the source electrode 216 to be electrically connected to the source electrode 216. The other side of the semiconductor layer 214 is electrically connected to each of the data lines.

The interlayer insulation film 215 and the source electrode 216 are converted with an insulation film 217 made of SiN, for example. The insulation film 217 is covered with a flatness layer 218 formed of an acrylic resin, for example. The flatness layer 218 is opened on the source electrodes 216 and the reflective film 26 is formed at predetermined locations on the flatness layer 218. The flatness layer 218 and the reflective film 26 including the insides of the openings on the source electrodes 216 are covered with an insulation film 28 made of SiN, for example.

Openings for exposing the source electrodes 216 are formed through the insulation film 217 and the insulation film 28. Conductive film 22A, 22B, and 22C covering each of the source electrodes 216 exposed inside each of the openings are provided in this order. In addition, there is provided a connective conduction portion including three-layered conductive films 22A, 22B, and 22C. Here, the conductive films 22A, 22B, and 22C are all formed of an ITO. The thickness of the conductive film 22A is about 50 nm, the thickness of the conductive film 22B is about 50 nm, and the thickness of the conductive film 22C is about 30 nm, for example.

The connective conduction portion is formed along a side wall of each opening of the insulation film 217 and a side wall of each opening of the insulation film 28, and extends toward the reflective film 26. In addition, the connective conduction portion is formed continuously up to the end of the reflective film 26, that is, the periphery and the edge of the reflective film 26 beyond a stepped portion of the insulation film 28 on the end. Several of the conductive films 22A, 22B, and 22C included in the connective conduction portion are drawn up to the center of the reflective film 26. The connective conduction portion is covered with the partition wall 25. Moreover, the partition wall 25 is opened on the center portion of the reflective film 26. A side wall of the opening of the partition wall 25 is formed in a taper shape in which a diameter of the opening increases as the diameter becomes more away from the reflective film 26. The inside of the opening is provided with the organic functional layer 23.

As illustrated in FIG. 2A, in the portion corresponding to the blue member 323, the conductive film 22A covers only the periphery of the reflective film 26 and is formed outside the opening of the partition wall 25. The conductive film 22B is formed beyond the stepped portion of the conductive film 22A and the insulation film 28 up to the center portion further than the conductive film 22A and is formed outside the opening of the partition wall 25. The conductive film 22C is formed beyond the stepped portion of the conductive film 22A and the insulation film 28 and beyond the stepped portion of the conductive film 22A and the conductive film 22B up to the center portion of the reflective film 26 and is formed in the entire inside of the opening of the partition wall 25. That is, the conductive film 22c functions as the pixel electrode 22 inside the opening of the partition wall 25. The thickness of the pixel electrode 22 in the portion corresponding to the blue member 323 is the thickness (for example, about 30 nm) of the conductive film 22C.

As illustrated in FIG. 2B, in the portion corresponding to the green member 322, the conductive film 22A covers only the periphery of the reflective film 26 and is formed outside the opening of the partition wall 25. The conductive film 22B and the conductive film 22C are formed beyond the stepped portion of the conductive film 22A and the insulation film 28 up to the center portion of the reflective film 26 further than the conductive film 22A and are formed in the entire inside of the opening of the partition wall 25. That is, a two-layered film formed by the conductive film 22B and the conductive film 22C inside the opening of the partition wall 25 functions as the pixel electrode 22. The thickness of the pixel electrode 22 in the portion corresponding to the green member 322 is a sum (for example, about 80 nm) of the thickness (for example, about 50 nm) of the conductive film 22B and the thickness (for example, about 30 nm) of the conductive film 22C.

As illustrated in FIG. 2C, in the portion corresponding to the red member 321, the conductive film 22A, the conductive film 22B, and the conductive film 22C, that is, all the layers of the connective conduction portion are formed up to the center portion of the reflective film 26 and are formed in the entire inside of the opening of the partition wall 25. That is, a three-layered film formed by the conductive film 22A, the conductive film 22B, and the conductive film 22C inside the opening of the partition wall 25 functions as the pixel electrode 22. The thickness of the pixel electrode 22 in the portion corresponding to the red member 321 is a sum (for example, about 130 nm) of the thickness (for example, about 50 nm) of the conductive film 22A, the thickness (for example, about 50 nm) of the conductive film 22B, and the thickness (for example, about 30 nm) of the conductive film 22C.

The organic EL device 1 having the above-described configuration allows the TETs provided in the TFT substrate 21 to operate as the switching elements, so that an electric signal is supplied to the source electrodes 216 electrically connected to the TFTs at predetermined timing. The electric signal supplied to the source electrodes 216 are delivered to the pixel electrodes 22 of the organic EL elements through the connective conduction portions. In this way, when the electric signal is applied between the pixel electrodes 22 and the common electrode 24, the organic EL elements (luminescence elements) emit light in accordance with the electric signal. The light emitted from the organic EL elements becomes light having high luminescence brightness and a sharp spectrum by the space between the common electrode 24 and the reflective film 26, that is, the resonator, and then is emitted from the common electrode 24 to the color filter substrate 3. The emitted light passes through one of the red members 321, the green members 322, and the blue members 323 of the color filter layer 32 to become predetermined color light. The wavelength (resonant wavelength) of the light passing through the respective color members is adjusted by the thickness of the respective pixel electrodes 22 in the organic EL elements emitting the light, so that good color light is formed and emitted to a display unit. The organic EL device 1 is capable of realizing a satisfactory display.

The pixel electrodes may be formed by several of the conductive films included in the connective conduction portion. For example, when the three types of conductive films having different thickness from each other are used, a single layer of the three conductive films is set to each pixel electrode in correspondence to R, G, and B. In this way, three different types of pixel electrodes can be obtained. In addition, when the connective conduction portion including three layers are used, the connective conduction portions are configured and the locations of ends of the conductive films which do not form the first electrodes are away from the pixel openings by a distance of the lower conductive film according to this embodiment. However, the locations thereof may be close to the pixel openings by the distance of the lower conductive film.

Manufacture Example

Next, a method of manufacturing the organic EL device 1 will be described. As the manufacture example, a method of forming the pixel electrodes 22 which are the feature of the invention will be described.

Before forming the pixel electrodes 22, the TFT substrate 21 or the like is formed. For example, the scanning lines are formed in the substrate 211 and parts of the scanning lines are configured as the gate electrodes 212, which are covered with the gate insulation film 213. Subsequently, the data lines are formed on the gate insulation film 213 and the semiconductor layer 214 electrically connected one ends of the data lines is formed. Subsequently, the interlayer insulation film 215 covering the semiconductor layer 214 is formed, and then the openings formed through the interlayer insulation film 215 to expose the other ends of the semiconductor layer 214 are formed. Subsequently, the source electrodes 216 are formed inside the openings and on the interlayer insulation film 215 of the periphery of the openings. Subsequently, the insulation film 217 covering the source electrodes 216 and the interlayer insulation film 215 and the flatness layer 218 are formed in this order. The thickness of the insulation film 217 is about 200 nm, for example. The thickness of the flatness layer 218 is about 3000 nm, for example. In the formation of the insulation film 217 and the flatness layer 218, a known formation material or a known formation method may be used.

Subsequently, the reflective film 26 is formed at a predetermine location of the flatness layer 218. For example, when the size of the light emission pixels is about 220 μm in the arrangement direction of the light emission pixels and about 70 μm in the direction perpendicular to the arrangement direction, the size of the reflective film is generally about 170 μm in the arrangement direction and about 60 μm in the direction perpendicular to the arrangement direction. In the embodiment, the reflective film 26 having a width of 185 μm, for example, in the arrangement direction is formed. In this way, the satisfactory pixel electrodes 22 described below can be formed without making the pixel openings small.

Subsequently, the openings formed through the flatness layer 218 and exposing the insulation film 217 on the source electrodes 216 are formed. Subsequently, the insulation film 28 covering the flatness layer 218 including the inside of the openings and covering the reflective film 26 is formed with about 50 nm, for example. Subsequently, the openings formed through the insulation film 217 and the insulation film 28 and exposing the source electrode 216 are formed.

Subsequently, the connective conduction portions covering the exposed source electrodes 216 and the periphery of the reflective film 26 are formed. Here, the three-layered conductive films 22A, 22B, and 22C included in the connective conduction portion are formed sequentially from the thicker conductive film to form the connective conduction portion.

The conductive film 22A covering the reflective film 26 in a portion corresponding to the blue member 323 and covering only the periphery of the reflective film 26 in the reflective film 26 in a portion corresponding to the green member 322 is formed. For example, after a non-formation area of the conductive film 22A is covered with a mask pattern, a film is formed with a material for forming the conductive film 22A using a deposition method or a film is formed with the material for forming the conductive film 22A by covering the entire surface of the source electrode 216 and the insulation film 28 and using a sputtering method. Then, the film is subjected to patterning using a photolithographic technique or an etching technique. When the thickest conductive film 22A is formed, the occurrence of cut portion in the stepped portions of the periphery and the edge of the reflective film 26 is reduced, compared to a case where a thin conductive film is formed.

Subsequently, the conductive film 22B covering the conductive film 22A and covering the center portion of the reflective film 26 more than the conductive film 22A is formed. The conductive film 22B covers the entire surface of the reflective film 26 in the portion of corresponding to the green member 322 and covers only the periphery of the reflective film 26 in the portion of corresponding to the blue member 323. The conductive film 22B may be formed using the same method of forming the conductive film 22A. When the conductive film 22A is cut in the stepped portion, the cut portion is filled with the material for forming the conductive film 223 and thus a portion from the periphery of the cut portion to the inside of the cut portion can be covered with the material thanks to affinity with the conductive film 22A. Accordingly, the cut portion can be repaired, thereby considerably reducing the occurrence of the cut portion in the conductive film 22B.

Subsequently, the conductive film 22C covering the conductive film 22B and covering the entire surface of the reflective film 26 in a portion corresponding to the blue member 323 is formed. As for the conductive film 22C, the cut portion is prevented from occurring in the conductive film 22C thanks to the affinity of the material for forming the conductive film 22B and the conductive film 22C, since the conductive film 22B in which the cut portion rarely occurs is formed as an underlying film. Moreover, since the conductive film 22B is formed up to the center portion of the reflective film 26 more than the conductive film 22A, a stepped portion of the conductive film 22B and the insulation film 28 is divided into a stepped portion of the conductive film 22B and the conductive film 22A and a stepped portion of the conductive 22A and the insulation film 28. Accordingly, the respective stepped portions covered with the conductive film 22C have a smaller size than that of a stepped portion formed by the conductive film 22B and the insulation film 28. With such a configuration, the occurrence of the cut portion in the conductive film 22C is reduced.

As described above, the connective conduction portion is formed. Accordingly, it is possible to form the pixel electrode 22 formed by the conductive film 22C in the portion corresponding to the blue member 323, the pixel electrode 22 formed by the conductive film 22B and the conductive film 22C in the portion corresponding to the green member 322, and the pixel electrode 22 formed by the conductive film 22A, the conductive film 22B, and the conductive film 22C in the portion corresponding to the red member 321.

As described in the manufacture example, the organic EL device according to the invention is capable of preventing the cut portion from occurring in the connective conduction portion in the stepped portion of the periphery and the edge of the reflective film 26. Accordingly, it is possible to satisfactorily supply an electric signal from the TFTs of the TFT substrate 21 to the pixel electrodes 22 formed integrally with parts of the connective conduction portions, thereby emitting the organic EL elements with a high quality. As a result, a display failure caused by black points or the like is prevented, and thus the organic EL device capable of making a high quality display is realized.

Electronic Apparatus

Next, an electronic apparatus mounted with the organic EL device having the above-described configuration will be described.

Figure 3:
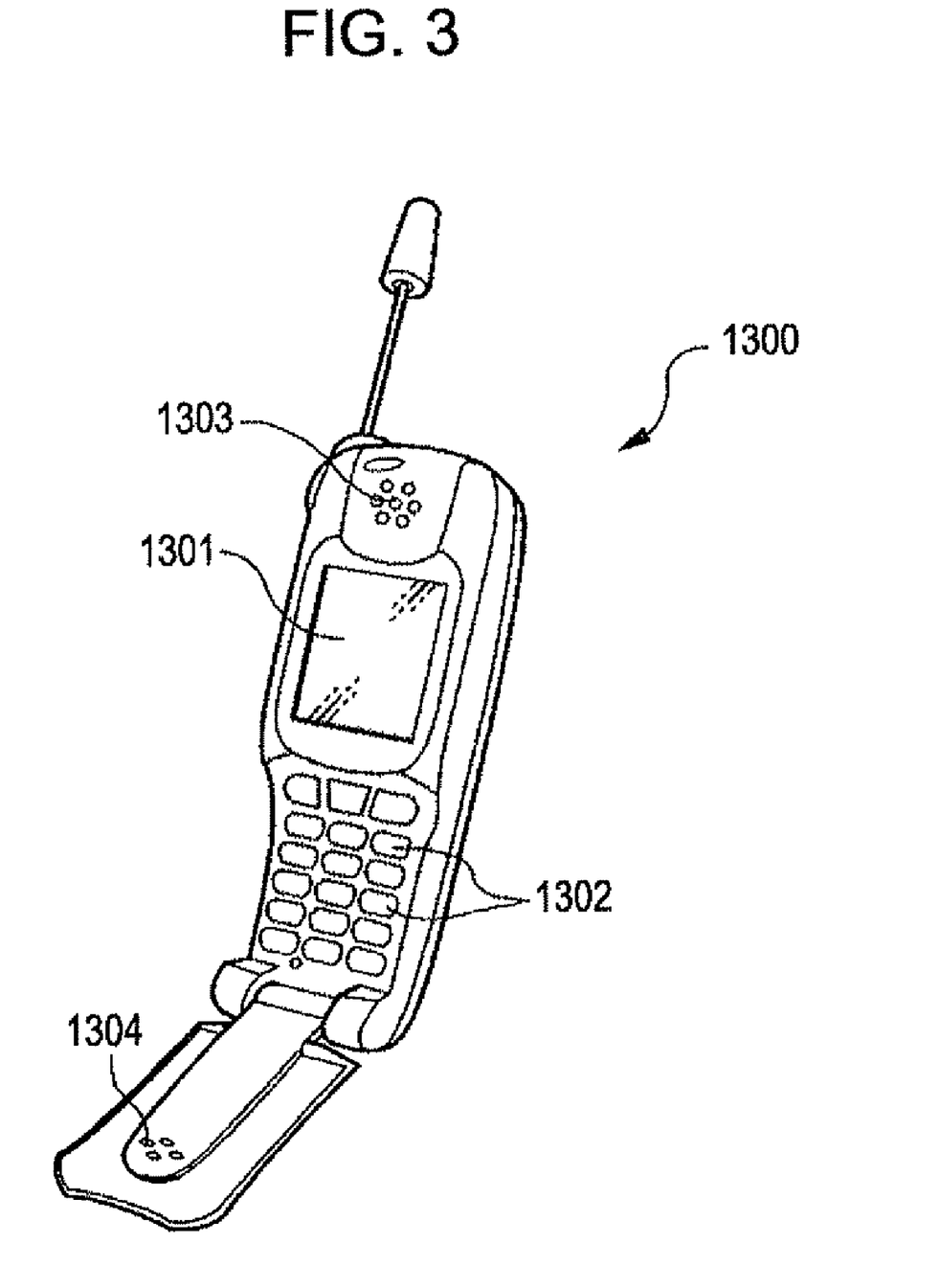
FIG. 3 is a perspective view illustrating an electronic apparatus according to the invention.

FIG. 9 is a perspective view illustrating an example of a cellular phone. As illustrated in FIG. 9, a cellular phone 1300 includes a plurality of operational buttons 1302, an ear piece 1303, a mouth piece 1304, and a display unit 1301 including the organic EL device having the above-described configuration. It is possible to realize an electronic apparatus including an organic EL display unit which is capable of making a high quality display and a bright display, since the cellular phone 1300 includes the organic EL device having the above-described configuration.

Examples of the electronic apparatus having the organic EL device include a digital camera, a personal computer, a television, a portable television, a view finder type or monitor direct vision-type video tape recorder, a PDA, a portable game apparatus, a pager, an electronic pocket book, a calculator, a watch, a word processor, a work station, a television phone, a POS terminal, an apparatus having a touch panel, a vehicle audio apparatus or a vehicle measuring instrument, and a vehicle display apparatus such as a car navigation apparatus.

What is claimed is:

1. An organic EL device comprising:
   a first electrode having a light-transmitting property;
   a transflective film;
   an organic light emission layer disposed between the first electrode and the transflective film;
   a reflective film disposed on an opposite side of the first electrode than the transflective film; and
   a first light emission pixel and a second light emission pixel including a connective conduction portion formed to cover a stepped portion of the end of the reflective film,
   wherein the connective conduction portion includes a plurality of conductive films having a light-transmitting property and is electrically connected to a switching element of the first light emission pixel,
   wherein the first electrode is formed by selecting and patterning at least one layer of the conductive films included in the connective conduction portion, and
   wherein a number of the conductive films included in the first electrode of the first light emission pixel is less than a number of the conductive films included in the connective conduction portion of the first light emission pixel.

2. The organic EL device according to claim 1, wherein the thickest conductive film among the conductive films included in the connective conduction portion is disposed closest to the reflective film.

3. The organic EL device according to claim 2, wherein the thickness of a first conductive film disposed close to the reflective film among the conductive films included in the connective conduction portion is equal to or larger than the thickness of a second conductive film disposed closer to the transflective film than the conductive film.

4. The organic EL device according to claim 1,
   wherein the connective conduction portion includes three or more conductive films, and
   wherein the locations of the ends of the conductive films which do not form the first electrode among the conductive films are different from each other on the periphery of the reflective film.

5. The organic EL device according to claim 1,
   wherein a partition wall is provided between the first light emission pixel and the second light emission pixel, and the end of the reflective film is covered with the partition wall.

6. The organic EL device according to claim 5, wherein the end of the conductive film which does not form the first electrode among the conductive films of the connective conduction portion is covered with the partition wall.

7. The organic EL device according to claim 5,
   wherein the first light emission pixel and the second light emission pixel have different emission wavelengths,
   wherein the thicknesses of the first electrode of the first light emission pixel and the thicknesses of the first electrode of the second light emission pixel are different from each other because of the thicknesses of the conductive films selected in the connective conduction portion, and
   wherein the emission wavelengths of the first light emission pixel and the second light emission pixel are resonant wavelengths determined by an optical distance between the transflective film and the reflective film forming the first light emission pixel and the second light emission pixel, and the optical distance is adjusted with the thickness of the first electrode forming the first light emission pixel and the second light emission pixel.

8. The organic EL device according to claim 5, further comprising a color filter layer transmitting light of wavelengths corresponding to the emission wavelength of the first light emission pixel and the emission wavelength of the second light emission pixel having the transflective film and formed opposite side of the transflective film than the reflective film.

9. The organic EL device according to claim 8, further comprising a third light emission pixel;
   wherein the color filter layer is provided with three types of color material members transmitting light having three kinds of different wavelengths,
   wherein the connective conduction portion includes three-layered conductive films, and
   wherein the first light emission pixel having the first electrode formed by one-layered conductive film, the second light emission pixel having the first electrode formed by two-layered conductive films, and the third light emission pixel having the first electrode formed by the connective conduction portion are provided.

10. An electronic apparatus comprising the organic EL device according to claim 1.

* * * * *